April 11, 1967 B. R. ZINGALI 3,313,017

FABRICATION OF ELECTRICAL APPARATUS

Filed Oct. 12, 1962 2 Sheets-Sheet 1

INVENTOR
B. R. ZINGALI
BY A. J. Nugent
ATTORNEY

April 11, 1967 B. R. ZINGALI 3,313,017

FABRICATION OF ELECTRICAL APPARATUS

Filed Oct. 12, 1962 2 Sheets-Sheet 2

INVENTOR
B. R. ZINGALI
BY A. J. Nugent
ATTORNEY

United States Patent Office 3,313,017
Patented Apr. 11, 1967

3,313,017
FABRICATION OF ELECTRICAL APPARATUS
Bazil R. Zingali, Haverhill, Mass., assignor to Western Electric Company, Incorporated, New York, N.Y., a corporation of New York
Filed Oct. 12, 1962, Ser. No. 230,193
5 Claims. (Cl. 29—155.58)

This invention relates to devices having threaded surfaces and particularly to adjustable inductor devices and a method of fabricating same.

In the manufacture of widely-used electrical devices such as inductors or transformers, it is often necessary to produce either a product having definite ascertained electrical values or one that is variable within prescribed limits. Since variations will probably occur from one assembly to the next due to factors like material structure, assembly differences or time and temperature changes, an adjustment must be provided to obtain a product of constant electrical properties where such is desired. On the other hand, an adjustment must also be provided where it is necessary to tune the device for operation with other circuit components. For example, in the fabrication of inductors having ferrite cores, a delicate tuning element is inserted into the air gap of the ferrite cores and adjusted therein to control the magnetic field. The inductor may thereby be tuned for resonance with a capacitor in numerous circuit applications.

In printed circuit board applications, great numbers of relatively small size inductors are used in circuit combinations with capacitors. By utilizing an inductor which is variable over a prescribed range, it is possible to adjust the inductor for resonance in combination with a capacitor. A precise adjustment may be made and less expensive capacitors with broader tolerances may be used in the resonant circuit.

The insertion of a tuning element into a magnetic material for precise adjustments creates several problems. Firstly, the tuning element must be capable of gradual insertion in well-defined steps and secondly, the electrical properties must vary proportionately with the degree of insertion and the proximity of the element to the air gap. Since for some applications, particularly at low frequencies, a ferrite inductor core is preferable, a possible solution, tapping a thread in the core and inserting a threaded tuning element, is ruled out by the brittle nature of the material. Furthermore, a ferrite tuning element threaded into a ferrite core would accelerate wear due to abrasive action or chipping. Since the proximity of the tuning element to the core is an important design consideration, attempts have been made to employ other methods such as slotted polyester-film inserts with internal embossings. These methods have generally proven unsatisfactory due to dimensional variations and cost factors.

Accordingly, an object of this invention is to form a thread in a body of material.

Another object of this invention is to produce electrical devices of an adjustable nature in an inexpensive and expeditious manner.

A further object of this invention is to effectively form a thread in a brittle material, such as a ferrite, where the proximity of the material to an engaging object is of importance.

A more specific object of this invention is to provide a device capable of graduated variations in inductance over a predetermined range.

In accordance with the general features of this invention, a thread is formed in a body of material by shrinking an envelope of heat shrinkable material about a threaded member. The surface of the envelope is then coated with an adhesive substance and the threaded member with the envelope shrunk thereon is inserted into an aperture in the body. The envelope is bonded to the walls of the aperture and the threaded member is withdrawn leaving a formed thread in the body of material.

One example of the invention relating to a method of producing adjustable electrical devices such as inductors, etc., having segmented ferrite cores comprises firstly the steps of inserting a threaded element into a heat shrinkable envelope and heating to shrink the material about the element. An adhesive coating is then applied to the proper parts of various elements such as the mating surfaces of a pair of core sections and the outer surface of the heat shrinkable material. A winding assembly is inserted into a cavity defined by the cores and the threaded element with the heat shrinkable envelope is inserted into an adjustment hole extending centrally through the cores. The cores are clamped securely for air drying and braking operations under controlled conditions which achieve the desired bonding effect. Upon completion of these operations, the threaded element is removed leaving a thin walled thread of heat shrinkable material on the brittle ferrite core. A delicate threaded tuning element is screwed into the threaded adjustment hole to complete the assembly.

This invention provides a novel device of excellent electrical characteristics by a method which is less expensive and produces a superior assembly to that made by the prior art. For example, a time consuming core tapping operation which would result in numerous rejects and a product of questionable durability is avoided. There is also no need to maintain close tolerances, usually a costly proposition, on the heat shrinkable envelope of this unique device. Further, the device is ideally suited for large scale production and requires only simple assembly skills.

These and other objects and advantages will become more apparent when considered in conjunction with the accompanying drawings, wherein.

Figure 1:
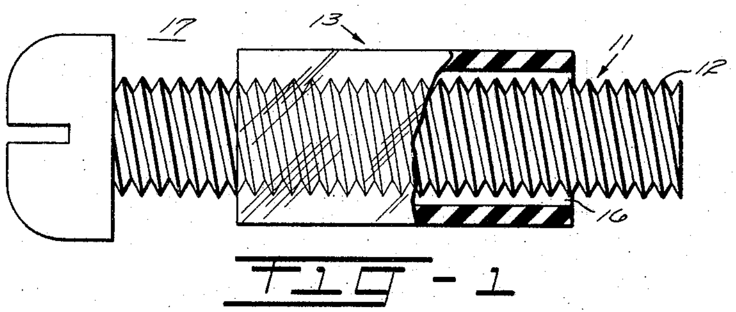
FIG. 1 is a front view of a threaded forming element with a surrounding heat shrinkable envelope.
Figure 2:
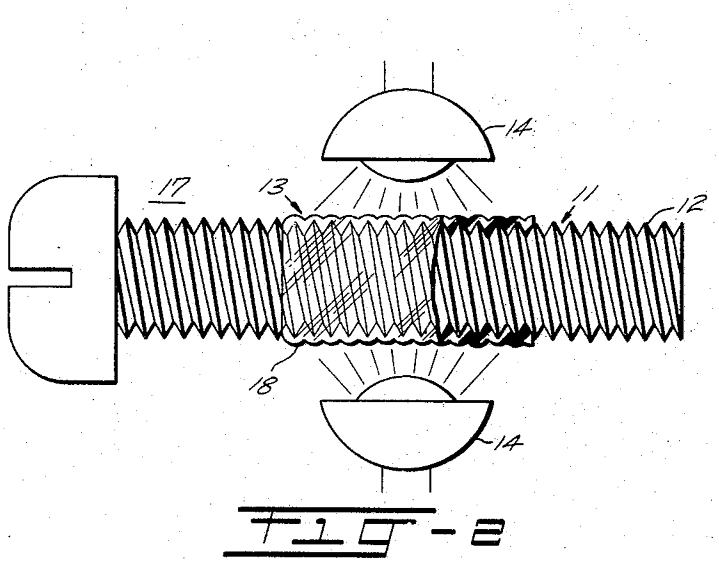
FIG. 2 is a front view of the heat shrinkable material subjected to a source of heat energy to take the shape of the forming element.

With reference to FIG. 1 of the drawings, an element 11 having a threaded outer surface 12, in a preferred embodiment, is inserted within an envelope 13 of heat shrinkable material such as Mylar, etc. The clearance dimension 16 of the envelope 13 is selected to facilitate assembly and provide a proper fit upon shrinking. One advantage of this assembly 17 is that the envelope need not be held within precise tolerances. After assembly, the temperature is raised by a suitable heat source 14 as shown in FIG. 2, shrinking the heat shrinkable material 13 onto the element 11 and forcing it to take the shape of said element. The assembly 17 is heated until the heat shrinkable material has passed through a substantial portion of its shrink cycle. A typical shrinking operation for the example cited herein would be conducted at about 250° F. for approximately five minutes.

Figure 3:
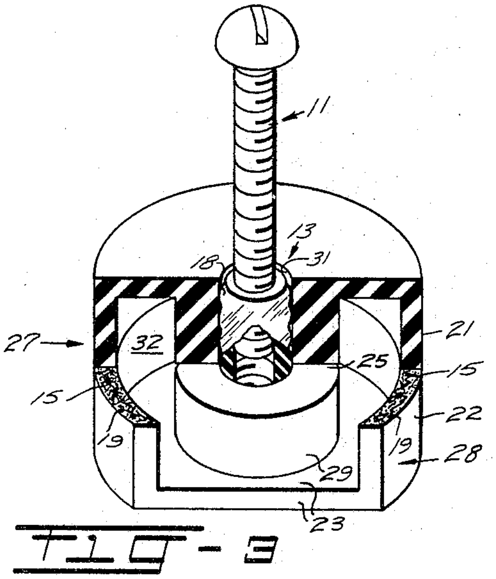
FIG. 3 is a cutaway isometric view showing the forming element being removed from a core assembly leaving the heat shrinkable envelope on the walls of a central aperture.
Figure 5:
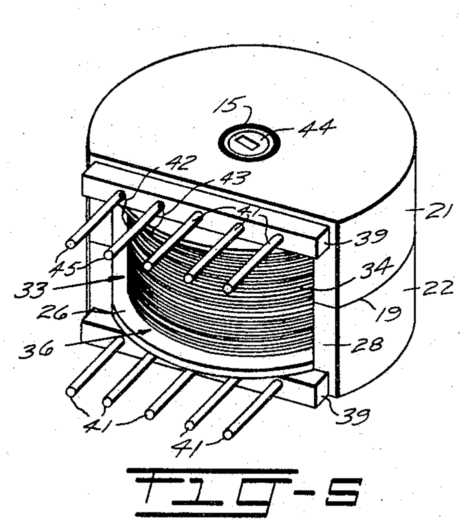
FIG. 5 shows a complete inductor assembly.

An adhesive coating 15 of a material such as Bondmaster E 621 Adhesive manufactured by The Rubber and Asbestos Corporation of Bloomfield, N. J., is applied as illustrated in FIG. 3 to the formed outer surface 18 of the material on the forming screw 11, to the mating surfaces 19 of a pair of core sections 21, 22 and to core surfaces 23 where contact is made with a spool head 26 (FIG. 5). The core sections 21, 22 could, for example, be made of a manganese zinc ferrite material. A core 27 comprises two matching sections 21, 22 having an external surface 28 forming a segmented hollow cylinder and a centrally located cylinder or center post 29 concentric with the outer cylindrical surface 28. A small air gap 25 separates the two sections of the center post 29. An aperture 31 extends axially through the inner cylinder 29 while the space 32 is utilized to contain a winding assembly 33.

Figure 4:
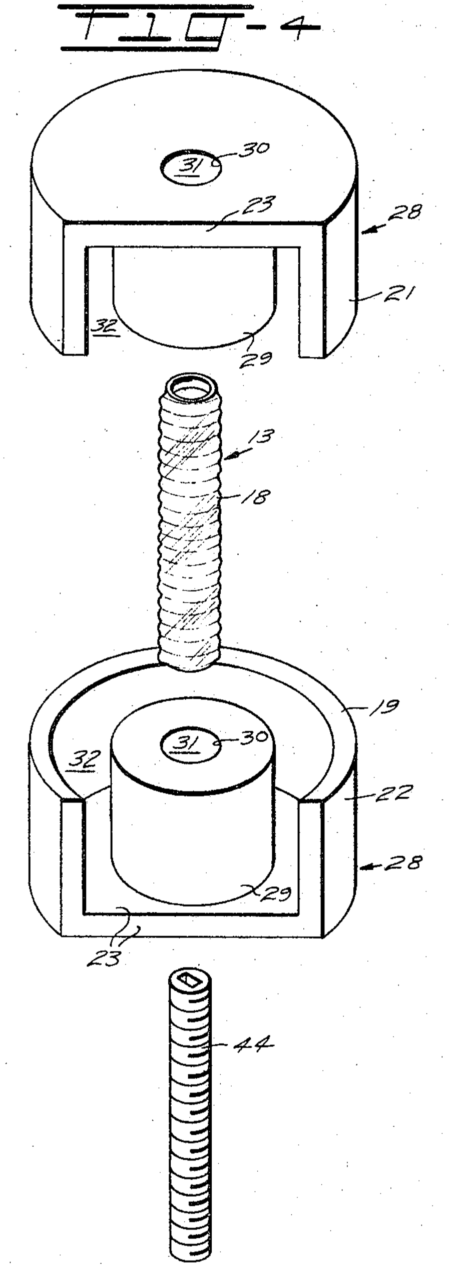
FIG. 4 is an isometric view showing a core assembly in a disassembled state.

The winding assembly 33 shown in FIG. 4 comprises a predetermined number of turns of fine wire 34 on a spool 36, typically of plastic material, having spool heads 26 at either end with rectangular projecting portions 39 along the segmented outer surface 28. The portions 39 have a plurality of terminals 41 suitable for insertion into printed boards in order to make circuit connections with other components such as resistors and capacitors. The ends 42, 43 of the wound wire 34 are connected to two of the terminals 45 which in turn may be strapped to the other terminals 41 if further connections are desired. The plurality of terminals 45 are entirely suitable for use as a type of terminal panel.

When the adhesive coatings have been applied to the aforesaid surfaces, the winding assembly 33 is placed between the mating core sections 21 and 22. The forming element or screw 11 with the heat shrinkable material 13 is inserted into the core aperture 31. The core sections 21, 22 with the winding assembly 33 situated therebetween in the space 32 and the screw assembly 17 in aperture 31 are clamped under a pressure of about five pounds and air dried for approximately one hour. The entire assembly 27 is then heated to temperatures in the region of 240° F. to 260° F. for a time interval of about 15 hours.

The thread forming element 11 is then removed, leaving a thin walled Mylar thread on the brittle ferrite material. In the embodiment set forth for purposes of illustrating the invention, the screw 11 is disengaged from the cylinder 13 by the rotary motion of a suitable manual or automatic tool and since the bonding action of the adhesive is greater than the holding action of the Mylar 13, a thin walled thread is left behind on the interior surface 30 of the aperture 31.

A delicate threaded tuning slug 44 of ferrite material is then inserted into the threaded adjustment hole 31 to complete the assembly. The slug 44 having a "32 pitch" thread in the selected instance readily engages the Mylar thread and may be subjected to repeated adjustments with a minimum of deleterious wear. Furthermore, an inductor 27 with a tuning element 44 may in a typical instance have an adjustment range of ±5%. The inductor is therefore readily tuned for resonance in combination with capacitors having tolerance spreads.

It is to be understood that the above described arrangements are simply illustrative of the principles of the invention. Numerous other arrangements may be readily devised by those skilled in the art which will embody the principles of the invention and fall within the spirit and scope thereof.

What is claimed is:

1. A method of fabricating an electrical device comprising the steps of:

shrinking an envelope of heat shrinkable material about a forming element, coating mating surfaces of a two-piece body of material and the outside surface of the formed envelope with an adhesive substance, mating the corresponding surfaces of the body with the envelope portion of the forming element located in an aperture in the body, bonding the adhesive coated surfaces, withdrawing the forming element leaving the formed heat shrinkable material on the walls of the aperture, and inserting into the aperture adjusting means which is arranged to vary the electrical characteristics of the device.

2. A method of fabricating inductor assemblies having brittle ferrite cores comprising the steps of:

shrinking a cylinder of heat shrinkable material about a threaded forming element, coating the mating surfaces of matching core sections and the outside surface of the formed cylinder with an adhesive substance, assembling the inductor including locating a winding assembly in the matching core sections and mating said sections, inserting the enveloped forming element into an aperture in the core sections, heating and air-drying to facilitate the bonding action of the adhesive substance, withdrawing the forming element leaving a thin-walled threaded surface on the walls of the aperture, and inserting meshing adjusting means into the threaded aperture to vary the electrical characteristics of the inductor assembly.

3. A method in accordance with claim 2 wherein:

the heat shrinkable material is put through substantially its entire shrink cycle during the shrinking step and wherein the bonding force of the adhesive substance is greater than the holding force of the heat shrinkable material on the forming element.

4. A method of fabricating inductor assemblies in accordance with claim 2 wherein:

the heat shrinkable material is heated to 250° F. for a predetermined time interval to shrink the cylinder about the threaded forming element, and the inductor assembly is heated to within the temperature range of 240° F. to 260° F. for a predetermined time interval in order to facilitate the bonding action of the adhesive substance.

5. A method of forming threads in a body of material comprising the steps of:

shrinking an envelope of heat shrinkable material about a threaded member, coating the surface of the envelope with an adhesive substance, inserting the threaded member with the envelope shrunk thereon into an aperture in the body, bonding the envelope to the walls of the aperture, and withdrawing the threaded member from the aperture.

References Cited by the Examiner

UNITED STATES PATENTS

| | | | |
|---|---|---|---|
| 1,265,706 | 5/1918 | Bardeen | 29—447 XR |
| 1,693,838 | 12/1928 | Faudi | 29—447 |
| 2,464,029 | 3/1949 | Ehrman | 29—155.58 |
| 2,586,320 | 2/1952 | Ford | 29—155.58 |
| 2,722,664 | 11/1955 | Duncan | 336—83 XR |
| 2,748,357 | 3/1956 | Garcia | 336—83 |
| 2,786,983 | 3/1957 | Hill | 336—83 |
| 2,894,231 | 7/1959 | Krasno | 336—83 |
| 2,939,096 | 5/1960 | Gordon. | |
| 2,949,641 | 8/1960 | Quackenbush. | |
| 3,028,570 | 4/1962 | Taylor | 336—83 |
| 3,093,177 | 6/1963 | Villo | 264—249 XR |
| 3,113,408 | 12/1963 | Kirkpatrick. | |
| 3,157,449 | 11/1964 | Hennessey | 264—230 XR |

JOHN F. CAMPBELL, *Primary Examiner.*

JOHN L. BURNS, *Examiner.*

W. M. ASBURY, R. F. DROPKIN, *Assistant Examiners.*